Dec. 16, 1969 D. B. ROSSER 3,484,660

SEALED ELECTRICAL DEVICE

Filed Feb. 12, 1965 3 Sheets-Sheet 1

INVENTOR:
DANIEL B. ROSSER,
BY Irving H Marshman
ATTORNEY.

SEALED ELECTRICAL DEVICE

Filed Feb. 12, 1965 3 Sheets-Sheet 2

INVENTOR:
DANIEL B. ROSSER,
BY
ATTORNEY.

INVENTOR:
DANIEL B. ROSSER, 3,484,660

SEALED ELECTRICAL DEVICE

Daniel B. Rosser, Philadelphia, Pa., assignor to General Electric Company, a corporation of New York Continuation-in-part of application Ser. No. 312,705, Sept. 30, 1963. This application Feb. 12, 1965, Ser. No. 436,711
Int. Cl. H01l 3/00, 5/00, 9/00
U.S. Cl. 317—234 17 Claims

ABSTRACT OF THE DISCLOSURE

For packaging a semiconductor controlled rectifier, a healed housing is crowned with a metal cap that is electrically connected to one of the main electrodes of the housing and that supports the outer shell of a coaxial cable connector whose inner conductor is electrically connected to the control electrode of the enclosed semiconductor body. In a silent device, all parts of the package are made of essentially nonmagnetic material.

This in a continuation-in-part of application Ser. No. 312,705, filed Sept. 30, 1963 now abandoned.

This invention relates to sealed electrical devices, more particularly to sealed semiconductor devices, and it has for an object the provision of a simple, reliable and improved device of this character.

Another object of my invention is the provision, for housing either a semiconductor diode or a semiconductor controlled rectifier of relatively high current rating, of a rugged and reliable package that can be manufactured with comparative ease and economy.

More specifically, the invention relates to electrical devices in which a semiconductor body is hermetically sealed within one of two chambers separated from each other by a metallic partition in a cylindrical enclosure having a ceramic sidewall, and it has for a further object, the provision of a gate lead to the semiconductor body that is constructed and arranged to withstand substantial mechanical stresses without being damaged.

A still further object of the invention is the provision of a gate lead that is substantially completely shielded from inductive and electrostatic sources and hence is substantially free from pickup from such sources.

By way of a brief summary of the invention, a semiconductor body having a plurality of zones arranged in succession is mounted within a cylindrical insulating enclosure. Contiguous zones are of opposite conductivity types. Each of the end zones is electrically connected to an exposed contact zone, and to each of these is connected a corresponding electrical conducting member disposed along the axis of the insulating enclosure. Each end of the cylindrical enclosure is joined to a corresponding one of the conducting members to provide an enclosed chamber. In one end of the enclosure, displaced from the longitudinal axis thereof, a coaxial cable connector may be mounted with its outer conducting shell electrically connected to one of the conducting members and its inner coaxial conductor electrically insulated from the shell. Within the enclosure an insulated conductor would be provided to connect the inner coaxial conductor of the connector to an intermediate zone of the semiconductor body.

Another aspect of the invention relates to minimizing the production of sound in the operation of semiconductor devices of relatively high current ratings. As heretofore constructed, such devices have produced considerable sound when employed in circuits subject to rapid fluctuations of current. The level of sound has been objectionably loud in applications where load current pulsates at a high frequency, for example 400 cycles per second. In military applications, such sound is undesirable because it reveals the location of the source. It is also objectionable because of its annoying psychological effect on human beings in the vicinity of the associated equipment. Accordingly, a further object of this invention is the provision of an enclosure for a semiconductor body which results in reducing the production of noise to a minimum.

Briefly summarized, a substantially silent semiconductor package may be produced by fabricating its structural elements of materials that are essentially non magnetic. The term "nonmagnetic material" as used in the following specification and claims includes all diamagnetic materials and any paramagnetic material that is characterized by negligible magnetostriction.

For a better and more complete understanding of the invention reference should now be had to the following specification and to the accompanying drawings of which FIGURE 1 is a view in elevation of a semiconductor enclosure and mounting means embodying the invention;

Figures 1, 2, 3:
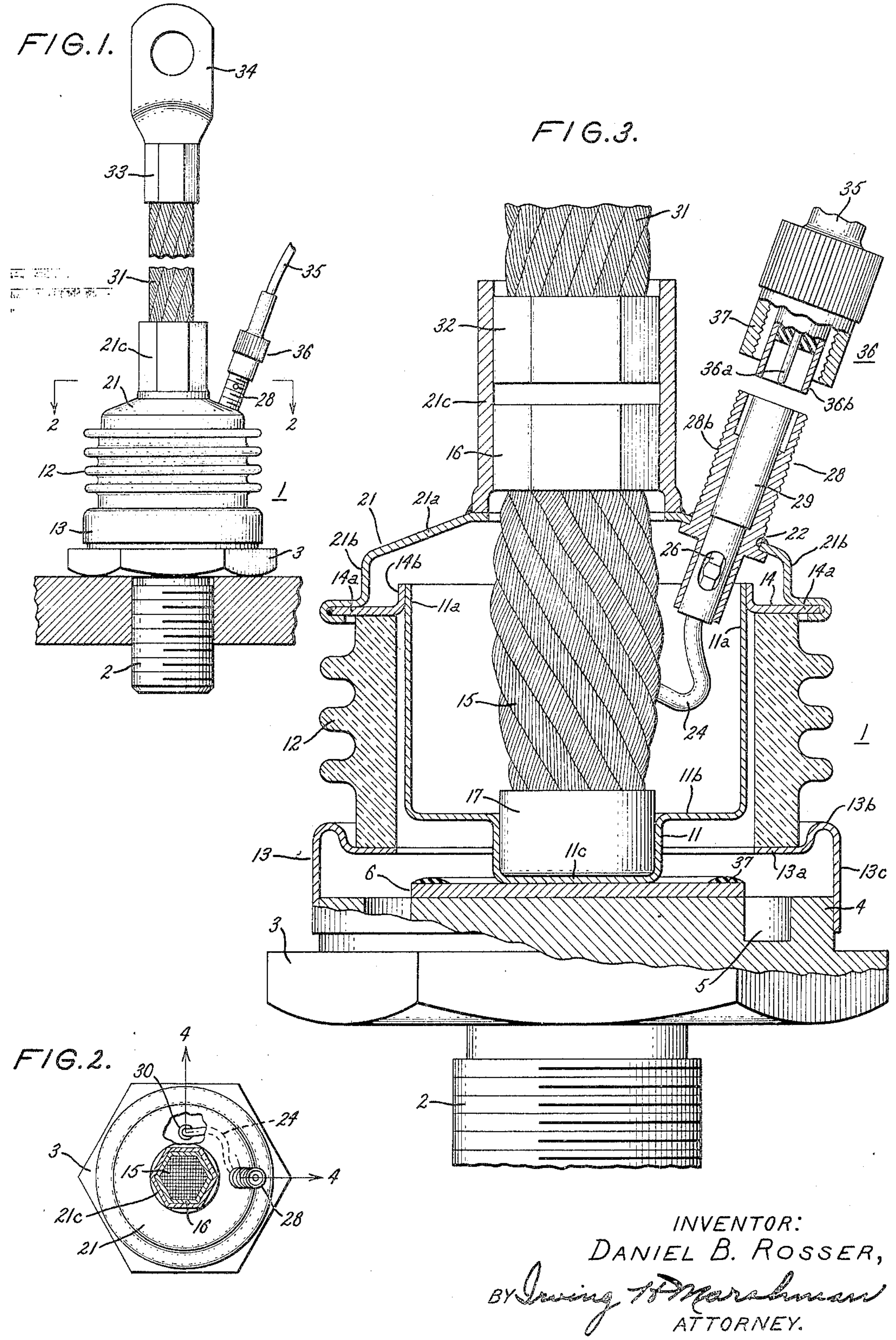
FIG. 2 is a top section plan view of the enclosure and mounting means taken along the line 2—2 of FIG. 1.
FIG. 3 is an enlarged view in elevation with parts broken away to reveal internal structural details.

Referring now to FIGS. 1–5 of the drawings, the hermetically sealed electrical device 1 comprises a combined thermal conductor, electrical contact and supporting member in the form of a stud 2 and a base 3. The stud and base act as the anode terminal and as a thermal path for the heat losses to the outside ambient. For this reason, the stud is threaded to provide a means of connection to a cooling fin (partially shown in FIG. 1) which may be of conventional form.

The base 3 has a hexagonally shaped lower portion and a circular mounting platform 4. It may be of any good electrical and heat conducting material such as copper, silver, aluminum or base alloys thereof. Copper is particularly satisfactory. In lieu of the illustrated stud 2, other means such as a clamp could be used for firmly securing the base 3 to a cooling fin or heat sink.

The mounting platform 4 of the supporting member 3 has a centrally disposed flat surface portion on which a semiconductor body may be mounted and to which it may be connected for electrical and thermal conduction. A stress relieving circular groove 5 is provided in the platform 4 and defines the boundary of the central mounting portion.

Figure 5:
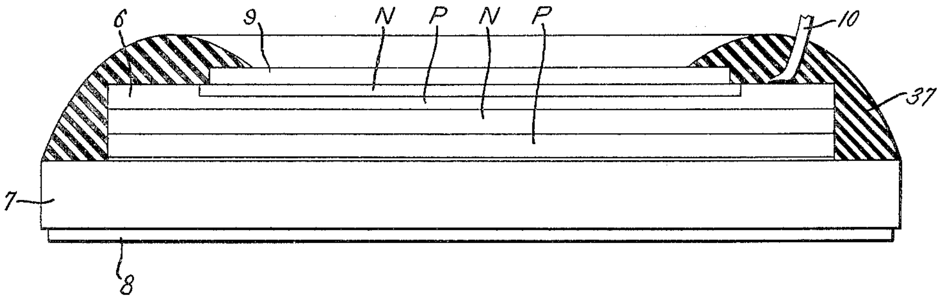
FIG. 5 is an enlarged view in elevation of a semiconductor body of a type suitable for use in the invention.

Mounted centrally on the portion of the platform within the circular area bounded by the groove 5 is an electrical component that embodies a semiconductor body 6. This element may be made of a semiconductor material such as silicon or germanium. It is illustrated in FIG. 5 as comprising four zones arranged in succession with contiguous zones being of opposite conductivity types to provide a PNPN semiconductor. However, it may have a greater or lesser number of zones. In order to protect the fragile junctions against thermal and mechanical stresses, the semiconductor body 6 is supported on a backing plate 7 made of a suitable material such as molybdenum. The device is provided with oppositely disposed contact surfaces 8 and 9 at opposite ends.

To provide operation of the semiconductor device as a controlled rectifier, a gate lead 10 is welded to one of the intermediate conducting zones as illustrated in FIG. 5. In the embodiment illustrated in the drawings, it is welded to the intermediate P zone. This gate lead may be a very thin wire of aluminum or other suitable conducting material. Owing to its configuration, the semiconductor device is generally known in the art as a "wafer." This wafer is sandwiched between the top surface of the mounting platform 4 and the outside bottom surface of the closed end of a metallic cup 11 which is illustrated in the broken away portion of FIG. 3. The side wall of the cup is stepped so that its outer open end 11*a* may be a predetermined standard size while its inner closed end is of a size that will leave an annular border strip of the wafer 6 exposed. This cup may be made of any suitable electrical conducting material. For example, it may be made of an iron-nickel alloy known to the trade as Ferni which contains approximately 40 percent nickel and 60 percent iron. Alternatively, if silent operation of the device is desired, the cup may be made of a non magnetic material having good electrical conducting properties. For example it may be made of a nickel copper alloy containing approximately 55 percent nickel and 45 percent copper and known to the trade as Monel 404.

The contact surface 8 of the wafer is in conductive engagement with the central area of the circular top surface area of the mounting platform 4. The reduced diameter closed end portion 11*c* of the cup 11 is conductively joined to the contact surface 9 of the wafer. If desired, the cup portion 11*c* can be effectively thickened by adding thereto a spacer that will be connected to the contact surface 9, the spacer being made of suitable electrical conducting material (for example Kovar or Fernico) having a coefficient of thermal expansion closely matching that of the semiconductor wafer 6. The annular area of the wafer radially beyond the contact surface 9, including the region where the gate lead 10 is welded, remains in the clear and it may be covered with room temperature-vulcanizing rubber insulation 37.

The wafer and the cup assembly are disposed within an enclosure that comprises a hollow body 12 of insulating material. This body may be a hollow impervious ceramic cylinder of which the exterior surface is provided with a plurality of circumferential ribs for the purpose of producing maximum electrical surface creepage path between the electrodes. The ceramic material has a high alumina content and is non magnetic. At its lower and upper ends the ceramic cylinder 12 is provided with metallic rings 13 and 14 respectively. As is best seen in FIG. 3, the lower ring 13 has a flat annular portion 13*a* with a radially outwardly extending portion 13*b* and a skirt portion 13*c* extending axially downward therefrom. The upper ring 14 comprises a flat annular radially outwardly extending flange portion 14*a* and an axially outwardly extending rim portion 14*b* of a cylindrical configuration slightly larger than the open end sidewall portion of cup 11. As shown in FIG. 3, it makes an overlapping telescopic engagement with the open end sidewall 11*a* of the cup 11 and it is joined thereto by a suitable method such as welding.

The rings 13 and 14 may be made of any suitable material. For example, if the cup 11 is made of the iron-nickel alloy Ferni the rings are preferably made of the same material. They may be joined to the end surface of the ceramic cylinder by a suitable well known technique for bonding metal to ceramic. The bottom ring 13 may be joined to the base mounting platform 4 by a suitable brazing technique. If silent operation of the device is desired, the rings 13 and 14 will be made of a suitable nonmagnetic material.

A short length of feed-in cable 15 is provided at its ends with ferrules 16 and 17. Preferably the cable is made of a stranded flexible conducting material such as copper. The ferrules may be of copper or other suitable conducting material. One end of the cable may be electrically joined to cup 11 by brazing the ferrule 17 at that end to the inside surface of the reduced diameter bottom of cup 11. Since copper is nonmagnetic, the use of copper cable and copper ferrules is conducive to silent operation of the device.

Figure 4:
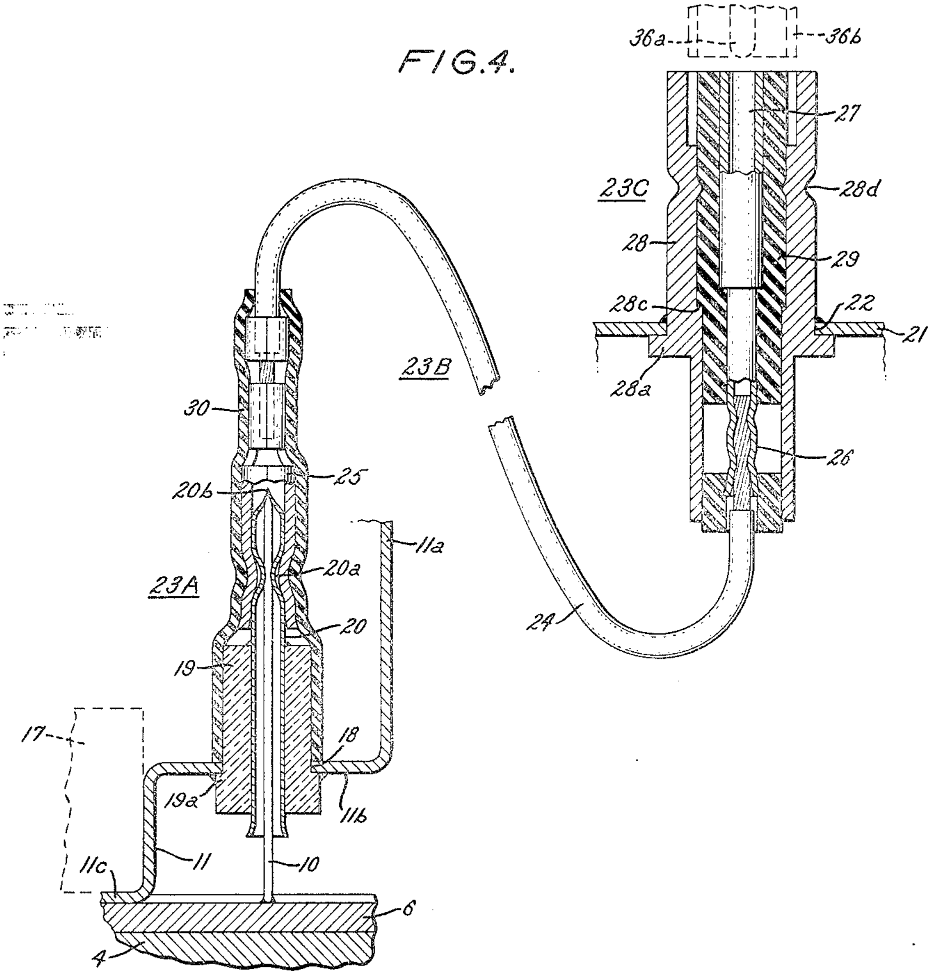
FIG. 4 is a fragmentary sectional view taken along the line 4—4 of FIG. 2.

As shown in FIG. 4 the stepped annular portion 11*b* of the sidewall of cup 11 is provided with a hole 18 to receive a gate feed-through assembly 23A. This assembly comprises a hollow ceramic insulating tube 19 having a shoulder 19*a*. This tube may be made of an impervious high alumina content insulating material. It is coated with an appropriate metallizing solution. A tube 20 made of a good conducting material such as copper is inserted in the ceramic tube 19 and this subassembly is then inserted through hole 18 until the shoulder 19*a* of the ceramic tube bears against the bottom surface of the stepped portion 11*b* of the cup 11. Brazing rings are positioned at the metallized surfaces and the ceramic insulator tube 19 is brazed to the cup 11.

In assembling the wafer subassembly to the base and ceramic subassembly, the top surface of the mounting platform 4 of the base 3 is precoated with a suitable alloy, e.g., an 80 percent gold-20 percent tin eutectic alloy. The contact surface 8 of the molybdenum backing plate 7 of the wafer subassembly may be a coating of a suitable alloy material such as 95 percent gold-5 percent nickel. The gold-nickel alloy is a disc which may be attached by heating in a forming gas protective atmosphere. The base is heated to liquify the gold-tin solder. The wafer, which could be preheated, is inserted within the ceramic enclosure with the contact surface 8 of the molybdenum backing plate in contact with the platform 4 of the base 3. The entire assembly is then allowed to cool.

The bottom surface of the cup 11 is copper plated and thereafter is precoated with a suitable material such, for example, as 90 percent tin-10 percent gold eutectic alloy. The top contact surface 9 of the wafer may be precoated with the same material.

The gate lead wire 10 from the wafer assembly is straightened and the cup 11 is inserted through the central opening in the top ring 14 into the hollow ceramic cylinder 12 with the copper tube 20 in alignment with the gate wire 10. During this step in the assembly, the gate wire 10 is inserted into and fed through copper tube 20. The unit as thus far assembled is now placed in a heater and the cup 11 is pressed down into the enclosure and its bottom surface joined to the contact surface 9 of the wafer. Following this, while still within an inert atmosphere, the unit is placed in a radio-frequency induction-welding device and the top edge 11*a* of the cup is welded to the rim 14*b* of upper ring 14. This completes the fabrication of the hermetically sealed portion of the device except for sealing the small remaining opening through the upper end of the copper tube 20 which, at this point in the assembly, is still open.

Following completion of the weld of the cup to the top ring, the tube 20 is crimped to the gate wire 10 at the point 20*a* as illustrated in FIG. 4. The crimp physically locks the gate wire in place. With the gate wire 10 still extending through it, the tube 20 is cold-weld pinched-off a short distance beyond the crimp at a designated location 20*b*. The tube 20 and the gate wire 10 are severed by the pinch-off operation. The weld produces a good electrical connection of the tube to the gate wire and the pinch-off completes the hermetic seal of the wafer within its chamber.

For the purpose of completing power feed-in connections to the wafer, the device is provided with a cap 21 as illustrated in FIGS. 1 and 3. This cap is made of a good electrical conducting material such as copper. It comprises an annular crown 21*a*, a downwardly extending skirt 21*b* and a tubular member 21*c* extending upwardly from the crown at the center thereof. A hole 22 is provided in the annular crown for making gate current feed-in connections.

Gate current feed-in connections to the gate wire 10 as illustrated in FIG. 4 include the gate feed-through assembly 23A, a gate lead assembly 23B, and a coaxial connector assembly 23C. The gate lead 24 comprises any suitable insulated wire cut to a predetermined length. For example it may be No. 26 A.W.G. stranded copper wire. Its ends are stripped and one end is crimped into a sleeve connector 25 and the other end is crimped into the coaxial center contact and insulation subassembly 26. The coaxial connector assembly 23C comprises the center contact and insulation subassembly 26 mounted within an outer shell 28. The inner female contact 27 of the subassembly 26 is captive and surrounded by a sleeve 29 of a suitable insulating material such for example as the tetrafluoroethylene polymer known as Teflon. The gate tube 20, sleeve connector 25 center contact 26 and parts thereof and outer shell 28 are made of non magnetic metals such as copper, brass, or non magnetic stainless steel.

The shell 28 has an external shoulder **28*a* and an outside thread 28*b* that extends from the outermost end downward towards the cap 21. It also has an internal shoulder 28*c*. In assembling, the shell 28 is placed in hole 22 with the shoulder 28*a* seated against the bottom surface of the crown of cap 21 and is joined thereto by suitable means such as brazing. This provides a good mechanical and electrical connection between the outer shell and the cap. With the sleeve connector 25 leading the way, the entire gate lead assembly 23B is passed downwardly through the outer shell 28 to a position at which an external shoulder on the insulating sleeve 29 seats against the internal shoulder 28*c* in the outer shell. This is the position illustrated in FIG. 4. As indicated at 28*d* both sides of the shell are then staked with a suitable staking tool to permanently retain the insulating sleeve 29** along with the rest of the gate lead assembly.

A predetermined length of heat shrinkable insulation tubing 30 is slid over the end of the sleeve connector 25 and up along the gate lead 24 leaving the connector 25 and lower end of the gate lead exposed. The heat shrinkable insulation tubing may be made of a suitable material such as an irradiated polyolefin plastic. Attachment of the gate lead to the pinched off copper tube 20 of the gate feed-through assembly 23A is accomplished by sliding the sleeve connector 25 down over the pinched off end of copper tube 20 and soldering it into place. The heat shrinkable insulation tubing is then slid down to cover the sleeve connector 25, the pinched off copper tube 20 and the ceramic insulator 19. It is then heated to shrink it to its final dimension and allowed to cool.

The cap 21 is then positioned on the top ring 14 of the hermetically sealed device subassembly with the upper ferrule 16 of the flexible cable 15 extending up into the central tube **21*c*. By means of a power tool, the outermost flange of the downwardly extending skirt 21*b* of the cap 21 is clamped around the edge of the annular flat extension 14*a* of the upper ring 14. A hexagonally-shaped crimp is made in the lower portion of the tube 21*c* to crimp it to the upper ferrule 16 of the cable 15** to obtain a reliable electric power connection to the device within.

A length of power feed-in cable 31 is provided at its ends with ferrules 32 and 33. One end 33 is inserted into the open end of a conventional cable terminal 34 and secured therein by means of a hexagonally-shaped crimp. Similarly, the other end 32 is inserted in the open top end of the central tube **21*c*** of the cap and secured therein by a hexagonally-shaped crimp.

External connections from the co-axial connector assembly to a source of gate circuit firing pulses is provided by means of a coaxial cable 35. At the adjacent end, cable 35 is provided with a coaxial connector element 36 having a central contact pin **36*a* and contact sleeve 36*b* which may be plugged into the receptacle in the mating coaxial connector assembly 23C as indicated in FIG. 4. The plug-in connector element 36 is provided with an internally threaded free turning collar 37 which may be screwed onto the threaded outer shell 28** to force the contact surfaces of the connector elements into tight engagement and to secure the plug-in member in place against unintentional removal.

In operation, the end P zone of the wafer functions as an anode and the end N zone functions as a cathode. Correspondingly the base 3 constitutes the anode terminal and the cable terminal 34 constitutes the cathode terminal.

The gate circuit extends from one terminal of the source of gate pulses to the inner conductor of coaxial cable 35 through the male and female inner contacts of the coaxial connector pair, the gate lead assembly 23B, the gate feed-through assembly 23A, and gate wire 10 to the intermediate P zone of the wafer. From the end N zone it extends through flexible cable 15, cap 21, outer shell 28 and contact sleeve **36*b*** of coaxial connectors, and outside conductor of coaxial cable to the other terminal of the source of gate pulses.

Figure 6:
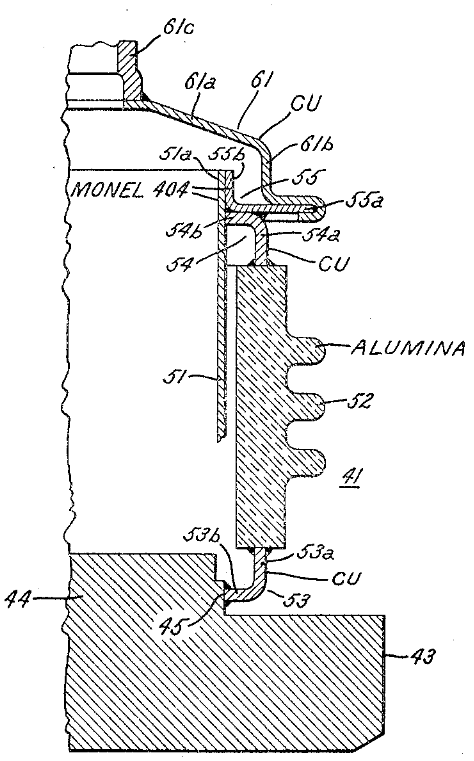
FIG. 6 is a partial view in section of a modified form of enclosure for a semiconductor device fabricated entirely of non magnetic materials.

With reference now to FIG. 6, another embodiment of my invention will be described. The enclosure and mounting means 41 illustrated in this figure is particularly well adapted to the production of rugged and silent semi-conductor devices. Being generally similar in construction to the previously described device that is depicted in full in FIGS. 1–3, it is only partially shown in FIG. 6.

The enclosure and mounting means 41 includes a power lead-in base 43 of non magnetic metal having good thermal and electrical conductivity, preferably copper. The base 43 has a central mounting platform 44 on the top surface of which there is supported a multizone semiconductor body (not shown in FIG. 6). The semiconductor body is intended to be the same as or similar to that shown in FIG. 5 and described hereinbefore, comprising, for example, either a PNPN controlled rectifier or a simple PN diode. One of its contact surfaces is held in electrical contact with the mounting platform 44 by suitable means, such as solder (described above) or resilient pressure applying means that can be provided for this purpose. The opposite contact surface of the semiconductor body is suitably connected to a cylindrical metallic cup 51 of non magnetic electrical conducting material such as Monel 404.

Since the configuration of the cup 51 is preferably the same as that of the cup 11 described above in detail, only the open end **51*a* of its full diameter annular area has been shown in FIG. 6. The cup 51 is disposed within an enclosure that includes a hollow cylindrical insulating body 52 formed of a ceramic material having a high alumina content. At its lower and upper ends the cylinder 52 is hermetically sealed to axially extending rims 53*a* and 54*a* of identical copper rings 53 and 54, respectively. The rims 53*a* and 54*a* are relatively thin and pliable, and as shown in FIG. 6 their butt joints with the cylinder 52** are filleted for extra strength.

The lower ring 53 has an inturned planar radially extending portion **53*b* that is hermetically sealed to an annular border area 45 around the semiconductor mounting platform 44 of the base 43 by a suitable brazing alloy, such as the eutectic alloy of silver and copper. The ring 53 will be precisely centered on the base by the platform 44, and its elevation relative to the base 43** is conveniently adjusted to suit before being permanently joined thereto.

The upper ring 54 has a planar radially-extending portion **54*b* that is joined with a hermetic seal to a corresponding portion 55*a* of a welding ring 55. The welding ring is made of the same material as the cup 51, and it has an upturned axially extending rim portion 53*b* of the same configuration as the open end sidewall structure 51*a* of the cup 51. Thus the rim 55*b* makes an overlapping telescoping engagement with the sidewall 51*a***, and these parts are welded together to effect a hermetic seal. It is apparent, therefore, that the combination of the two rings 54 and 55 shown in FIG. 6 is functionally equivalent to the ring member 14 previously described.

Within the cup 51, one end of a short length of flexible cable is disposed and secured to the reduced diameter area of the cup as before. A metallic cap of non-magnetic electrical conducting material such as copper joins the welding ring 55 of the hermetically sealed enclosure to this cable. The cap comprises a crown 61*a*, a downwardly extending flanged skirt 61*b* that is rolled over the protruding edge of the radially extending portion 55*a* of the welding ring 55, and a tubular member 61*c* extending upwardly from the crown at the center of cap 61. The tubu lar member 61*c* may be crimped to a ferrule of the lead-in cable (not shown in FIG. 6).

The exterior surface of the cap 61 and of certain other parts of the assembled package 41 may be flash coated with a thin film of nickel if desired. By limiting the thickness of this coating to less than approximately .004 inch, the essentially non-magnetic character of the structure is not compromised. With such a thin coating the quantity of nickel is too insignificant to produce any appreciable sound.

By using the above-described non-magnetic package, I have been able to realize a surprising reduction in the level of sound emitted by a semiconductor device that is subjected to rapidly changing load current. In one test conducted on 150-amp. controlled rectifier devices in a pulsating current circuit (60 c.p.s.), where each pulse of current rose at a rate of 40 amperes per microsecond to a 600-amp. peak, it was found that the effectiveness of the non-magnetic package as a source of noise was much less, by a factor of about 15 to 1, compared to a package having substantially the same dimensions but made with magnetic parts. The higher noise level of the latter device can be attributed principally to the magnetostrictive character of most magnetic material. When a body of this material is exposed to a changing magnetic field, it tends to change its dimensions with resulting vibration and noise. At certain frequencies of this vibration a resonance effect is produced and a more annoying noise is possible. This source of noise is drastically reduced by using non-magnetic material according to my invention.

While preferred forms of the invention have been shown and described by way of illustration, other modifications and alterations will readily occur to persons skilled in the art.

What I claim as new and desire to secure by Letters Patent of the United States is:

1. In combination:
(a) a semiconductor body having a plurality of at least three zones arranged in succession with contiguous zones being of opposite conductivity types and having a contact surface electrically connected to each of the end zones,
(b) main current conducting members electrically connected to each of said contact surfaces,
(c) an enclosure for said semiconductor body having a hollow insulating body joined to each of said conducting members,
(d) an aperture in said enclosure displaced from said conducting members,
(e) a coaxial cable connected passing through said aperture and having an outer conducting shell physically spaced and electrically connected with one of said conducting members and having an inner coaxial conductor electrically insulated from said shell, and
(f) means insulated from said one conducting member for electrically connecting said inner coaxial conductor to a zone of said semiconductor body.

2. In combination:
(a) a semiconductor device comprising a pair of spaced apart contact surfaces and a semiconductor body disposed between said surfaces and having a plurality of at least three zones arranged in succession with contiguous zones being of opposite conductivity types and each of the end zones of said semiconductor body being electrically connected to a corresponding one of said surfaces,
(b) electric conducting members electrically connected to each of said contact surfaces,
(c) a cylindrical enclosure for said semiconductor body including a hollow cylindrical insulating body,
(d) a metallic ring joining one end of said cylindrical insulating body to one of said conducting members,
(e) a metallic cap joining the other end of said cylindrical insulating body to the other of said conducting members,
(f) an aperture in said cap displaced from the longitudinal axis of said cylindrical enclosure,
(g) a coaxial cable connector passing through said aperture and having an outer conducting shell electrically connected with one of said conducting members and having an inner coaxial conductor electrically insulated from said shell, and
(h) an insulated conductor connection from said inner coaxial conductor to an intermediate conductivity zone of said semiconductor body.

3. In combination:
(a) a semiconductor device comprising a pair of spaced apart contact surfaces and a semiconductor body disposed therebetween and having a plurality of at least three zones arranged in succession with contiguous zones being of opposite conductivity types and each of the end zones of said semiconductor body being electrically connected to a corresponding one of said surfaces,
(b) a first electric conducting member secured to one of said contact surfaces,
(c) a length of flexible cable having one end electrically connected to the other of said contact surfaces,
(d) a cylindrical enclosure for said semiconductor body concentric with the longitudinal axis of said cable including a hollow cylindrical insulating body,
(e) a metallic ring joining one end of said cylindrical insulating body to said first conducting member,
(f) a metallic cap joining the other end of said cylindrical insulating body to said cable,
(g) an aperture in said cap offset from the longitudinal axis of said cylindrical enclosure,
(h) a coaxial cable connector passing through said aperture and having an outer conducting shell electrically connected to said cap and having an inner coaxial conductor electrically insulated from said shell and said cap, and
(i) an insulated conductor connection in the space between said cable and said cylindrical enclosure from said inner conductor to an intermediate zone of said semiconductor body.

4. In combination:
(a) a semiconductor device comprising a pair of spaced apart contact surfaces and a semiconductor body disposed therebetween and having a plurality of at least three zones arranged in succession with contiguous zones being of opposite conductivity types and each of the end zones of said semiconductor body being electrically connected to a corresponding one of said surfaces,
(b) a first electric conducting member secured to one of said contact surfaces,
(c) a cylindrical enclosure for said semiconductor body including a hollow cylindrical insulating body,
(d) a metallic ring joining one end of said cylindrical insulating body to said first conducting member with a hermetic seal,
(e) a cylindrical metallic cup mounted within said enclosure to provide a closed chamber for said semiconductor body, said cup having its sidewall stepped at its closed end to provide a bottom of reduced diameter and mounted with its bottom electrically secured to the other of said contact surfaces, (f) a second metallic ring joining the other end of said cylindrical insulating body to the open end of said cup with a hermetic seal, (g) a length of flexible cable having one end secured to the inside bottom surface of said cup, (h) a metallic cap joining said second ring to said cable, (i) an aperture in said cap offset from the longitudinal axis of said cylindrical enclosure, (j) a coaxial cable connector passing through said aperture and having an outer conducting shell electrically connected to said cap and having an inner coaxial conductor electrically insulated from said shell and from said cap, (k) a second aperture in the stepped portion of said sidewall of said cup, (l) a tubular insulator passing through said second aperture and joined to the stepped portion of said sidewall with a hermetic seal, (m) a tubular conductor member passing through said tubular insulator and joined thereto with a hermetic seal, (n) a gate wire having one end connected to an intermediate zone of said semiconductor body and the other end extending into said tubular conducting member, (o) said tubular conducting member being pinched off to weld it to said gate wire and to complete a hermetic seal for said semiconductor chamber, and (p) an insulated conductor connection from said inner coaxial conductor to said pinched off tubular conducting member.

5. In combination:

(a) a semiconductor device comprising a pair of spaced apart contact surfaces and a semiconductor body disposed therebetween and having a plurality of at least three zones arranged in succession with contiguous zones being of opposite conductivity types and each of the end zones of said semiconductor body being electrically connected to a corresponding one of said surfaces, (b) a base of electrical conducting material having at one end thereof a central mounting platform in electrical contact with one of said contact surfaces and an annular border area surrounding said platform, (c) a metallic cup having a stepped sidewall providing a full diameter annular area and a centrally disposed bottom area of reduced diameter axially outward beyond said annular area and having at its open end a sidewall structure of predetermined configuration, (d) said reduced diameter bottom area being in electrically conductive engagement with the other of said contact surfaces, (e) an enclosure for said semiconductor device including a hollow body of electrically insulating material having at one end thereof a bottom ring member joined to said annular border area of said base and having at the other end thereof a top ring member having an axially outwardly extending rim of the same predetermined configuration as the open end sidewall structure of said cup, (f) said rim being joined to said sidewall structure in overlapping telescoping engagement, (g) an aperture in the full diameter annular area of the sidewall of said cup, (h) a tubular conducting member passing through said aperture electrically insulated from said cup, (i) a gate wire having one end electrically connected to a zone of said semiconductor body and having the other end extending into said tubular conducting member and in electrical contact with the inside wall thereof, (j) a cap having a downwardly extending skirt joined to said top ring member and having an annular crown provided with a centrally disposed tube forming a lead-in opening, (k) a flexible cable electrically connected to the inside surface of said reduced diameter bottom area and to the inside surface of said tube, (l) an aperture in said crown, (m) a coaxial cable connector passing through said last-mentioned aperture and having an outer conducting shell in electrical contact with said crown and having an inner co-axial conductor electrically insulated from said shell, and (n) an insulated conductor connection from said inner coaxial conductor to said tubular conducting member.

6. In combination (a) a unidirectionally conductive semiconductor cell having oppositely disposed contact surfaces, (b) a supporting member of electrical conducting material having at one end thereof a central mounting platform in electrical contact with one of said contact surfaces and an annular border area surrounding said platform, (c) a metallic cup having a stepped sidewall providing a full diameter annular area and a centrally disposed bottom area of reduced diameter axially outward beyond said annular area and having at its open end a sidewall structure of predetermined configuration, (d) means for conductively joining said reduced diameter area to the other contact surface of said cell, (e) an enclosure for said cell including a hollow body of electrically insulating material having at one end thereof a first ring member joined to said annular border area of said supporting member and having at the other end thereof a second ring member having an inwardly extending portion and an axially outwardly extending rim, said rim having the same predetermined configuration as the open end sidewall structure of said cup and being joined thereto in overlapping telescoping engagement, (f) a length of flexible cable having one end disposed in said cup and secured to the reduced diameter area thereof, and (g) a metallic cap joining said second ring member to said cable, (h) said supporting member, cup, first and second ring members, cable, and cap all being made from essentially non magnetic material.

7. In combination:

(a) semiconductor device comprising a pair of spaced apart contact surfaces and a semiconductor body disposed between said surfaces and having a plurality of zones arranged in succession with contiguous zones being of opposite conductivity types and each of the end zones of said semiconductor body being electrically connected to a corresponding one of said surfaces;

(b) a pair of power lead-in conductors formed of nonmagnetic material and each electrically connected to a corresponding one of said contact surfaces, (c) a cylindrical enclosure for said semiconductor body including a hollow cylindrical insulating body disposed between said lead-in conductors, (d) a metallic ring formed of non magnetic material joining one end of said cylindrical insulating body to one of said conductors, and (e) means including a metallic cup formed of a non magnetic material joining the other end of said cylindrical insulating body to the other of said conductors.

8. In combination:

(a) a semiconductor device comprising a pair of spaced apart contact surfaces and a semiconductor body disposed therebetween and having a plurality of zones arranged in succession with contiguous zones being of opposite conductivity types and each of the end zones of said semiconductor body being electrically connected to a corresponding one of said contact surfaces, (b) a first electric conductor formed of metallic non magnetic conducting material in electrical contact with one of said contact surfaces, (c) a cylindrical enclosure for said semiconductor body including a hollow cylindrical ceramic insulating body formed of alumina, (d) a non magnetic metallic ring joining one end of said cylindrical insulating body to said first electrical conductor with a hermetic seal, (e) a cylindrical nonmagnetic metallic cup mounted within said enclosure to provide a closed chamber for said semiconductor body, said cup having its sidewall stepped at its closed end to provide a bottom of reduced diameter and mounted with its exterior bottom surface electrically secured to the other of said contact surfaces, (f) a second non magnetic metallic ring joining the other end of said cylindrical insulating body to the open end of said cup with a hermetic seal, (g) a length of flexible cable formed of a non magnetic electrical conducting material and having one end secured in electric contact to the interior bottom surface of said cup, and (h) a non magnetic metallic cap joining said second ring to said cable.

9. In combination:

(a) a semiconductor device comprising a pair of spaced apart contact surfaces and a semiconductor body disposed between said surfaces and having a plurality of zones arranged in succession with contiguous zones being of opposite conductivity types and each of the end zones of said semiconductor body being electrically connected to a corresponding one of said surfaces, (b) a pair of power lead-in conductors formed of a non-magnetic electrical conducting material and each electrically connected to a corresponding one of said contact surfaces, (c) a cylindrical enclosure for said semiconductor body including a hollow cylindrical insulating body formed of a ceramic material having a high alumina content disposed between said conductors, (d) a metallic sealing ring formed of non-magnetic material having a planar radially extending portion hermetically sealed to one of said lead-in conductors and having an axially extending rim hermetically sealed to one end of said insulating body to form a butt joint, (e) a second metallic sealing ring formed of a non magnetic material and having a planar radially extending portion and an axially extending rim hermetically sealed to the other end of said insulating body to form a butt joint, (f) a cylindrical non magnetic metallic cup mounted within said enclosure to provide a closed chamber for said semiconductor body, said cup having its sidewall stepped at its closed end to provide a bottom of reduced diameter and mounted with the exterior surface of said bottom electrically connected to the other of said contact surfaces, (g) a non magnetic welding ring having an axially extending rim portion welded to the sidewall of said cup at the open end thereof to effect a hermetic seal and having radially extending portion joined to said second sealing ring with a heremtic seal, (h) a length of flexible cable formed of a non magnetic electrical conducting material and having one end secured in electrical contact to the interior surfaces of the bottom of said cup, and (i) a non magnetic metallic cap joining said welding ring to said cable.

10. A semiconductor device secured to a base and enclosed within a cover comprising insulating lateral walls fixed to said base by metallic flanges, said walls provided with a metallic lid which provides a closure for said cover, said lid containing an insulated cross terminal intended to be connected to an electrode of the semiconductor device, said terminal being composed of a recess integral with the lid and having metallic walls which define an opening which extends into said lid, an insulating plug disposed in a vacuum tight manner inside said recess and in the lower portion thereof, said plug containing a metallic tube which extends through the plug in a vacuum tight relationship, said metallic tube receiving a connecting wire from an electrode of the semiconductor device, said connecting wire extending through the metallic tube, and secured to the upper portion of said tube in a vacuum tight manner, said cover further containing a current terminal means comprising a metallic cylindrical element containing an axial internal metallic channel which is insulated from said metallic cylindrical element by insulating means, said element being secured to the lid of the cover and extending for a distance into said recess provided in the cover such that the connecting wire which extends through the metallic tube of the cross terminal also extends into the axial channel of the current terminal where it is secured by seating with the walls of said channel.

11. The semiconductor device of claim 10, wherein the recess of the cross terminal in the cover is formed as part of the lid of the cover.

12. The semiconductor device of claim 10, wherein the recess of the cross terminal in the cover is brazed to the lid in a vacuum tight maner.

13. The semiconductor device of claim 10, wherein the connecting wire extending into the metallic tube is secured therein in a vacuum tight manner.

14. The semiconductor device of claim 10, wherein the axial channel is divided into two channels by a vacuum tight transverse partition means positioned above the level of the lid, said connecting wire being seated in the lower of said two channels.

15. The apparatus of claim 10, wherein the current terminal means is provided with lateral openings which extend through the wall of the metallic cylindrical elements and through the insulating means to the axial metallic channel.

16. The semiconductor device of claim 10, wherein the cover also contains a noninsulated terminal.

17. The semiconductor device of claim 10, wherein the walls of the cover are alumina.

References Cited

UNITED STATES PATENTS

| | | | |
|---|---|---|---|
| 2,965,818 | 12/1960 | Connell | 317—234.1 |
| 2,992,372 | 7/1961 | Himeon et al. | 317—234.1 |
| 3,068,382 | 12/1962 | Wagner | 317—234.4 |
| 3,361,943 | 1/1968 | Knott et al. | 317—234.4 |
| 2,897,419 | 7/1959 | Howland et al. | 317—234 |
| 3,234,437 | 2/1966 | Dumas | 317—234 |
| 3,237,063 | 2/1966 | Keller | 317—234 |
| 3,258,661 | 6/1966 | Mierendorf et al. | 317—234 |

FOREIGN PATENTS

| | | |
|---|---|---|
| 1,261,798 | 4/1961 | France. |

JERRY D. CRAIG, Primary Examiner

U.S. Cl. X.R.

174—50.52, 52